United States Patent
Sun et al.

(10) Patent No.: US 10,928,459 B2
(45) Date of Patent: Feb. 23, 2021

(54) BATTERY DETECTION CIRCUIT AND BATTERY MANAGEMENT SYSTEM

(71) Applicant: Contemporary Amperex Technology Co., Limited, Ningde (CN)

(72) Inventors: Zhanyu Sun, Ningde (CN); Zhimin Dan, Ningde (CN); Yizhen Hou, Ningde (CN); Jiechao Luo, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 133 days.

(21) Appl. No.: 16/113,424

(22) Filed: Aug. 27, 2018

(65) Prior Publication Data
US 2019/0064280 A1 Feb. 28, 2019

(30) Foreign Application Priority Data
Aug. 29, 2017 (CN) .......................... 201710758746.2

(51) Int. Cl.
| | |
|---|---|
| *G01R 31/389* | (2019.01) |
| *G01R 31/14* | (2006.01) |
| *G01R 31/327* | (2006.01) |
| *G01R 31/36* | (2020.01) |
| *G01R 27/02* | (2006.01) |

(52) U.S. Cl.
CPC ......... *G01R 31/389* (2019.01); *G01R 27/025* (2013.01); *G01R 31/14* (2013.01); *G01R 31/3278* (2013.01); *G01R 31/3648* (2013.01)

(58) Field of Classification Search
CPC .............. G01R 31/364; G01R 31/3274; G01R 31/3275
See application file for complete search history.

(56) References Cited

U.S. PATENT DOCUMENTS

| | | | |
|---|---|---|---|
| 2014/0095093 A1* | 4/2014 | Hong | ..................... G01R 31/50 702/63 |
| 2014/0159908 A1 | 6/2014 | Hong et al. | |
| | | (Continued) | |

FOREIGN PATENT DOCUMENTS

| | | |
|---|---|---|
| CN | 106199440 A | 12/2016 |
| DE | 102006050529 A1 | 4/2008 |

OTHER PUBLICATIONS

The extended European search report dated Feb. 12, 2019 for European Application No. 18191312.0, 7 pages.

*Primary Examiner* — Noam Reisner
(74) *Attorney, Agent, or Firm* — Law Offices of Liaoteng Wang

(57) ABSTRACT

The present disclosure provides a battery detection circuit and a battery management system. The battery detection circuit includes a positive relay, a negative relay, a first positive sampling unit, a first negative sampling unit, a second positive sampling unit, a second negative sampling unit, and a reference voltage terminal, wherein: all of the first positive sampling unit, the first negative sampling unit, the second positive sampling unit, the second negative sampling unit and a power battery pack to be detected are connected to the reference voltage terminal. With the battery detection circuit and the battery management system of the present disclosure, both the cost of the battery detection circuit and the complexity of the structure of the battery detection circuit can be reduced.

15 Claims, 9 Drawing Sheets

(56) References Cited

U.S. PATENT DOCUMENTS

| | | | |
|---|---|---|---|
| 2015/0115972 A1* | 4/2015 | Park | G01R 31/3278 |
| | | | 324/503 |
| 2016/0154064 A1* | 6/2016 | Klein | G01R 31/3277 |
| | | | 324/433 |
| 2016/0169945 A1* | 6/2016 | Mauder | G01R 31/3274 |
| | | | 324/126 |
| 2016/0252555 A1* | 9/2016 | Deumal Herraiz | G01R 35/00 |
| | | | 324/503 |
| 2018/0240629 A1* | 8/2018 | Ao | B60L 58/10 |

* cited by examiner

BATTERY DETECTION CIRCUIT AND BATTERY MANAGEMENT SYSTEM

CROSS-REFERENCE TO RELATED APPLICATION

This application is based upon and claims priority to Chinese Patent Application No. 201710758746.2, filed on Aug. 29, 2017, the content of which is incorporated herein by reference in its entirety.

FIELD

The present disclosure relates to the field of batteries, and more particularly to a battery detection circuit and a battery management system.

BACKGROUND

In view of the energy saving and the environmental protection provided by electric vehicles, it has become a trend of the automotive industry to use the electric vehicles instead of fuel vehicles. As a core component of an electric vehicle, an on-board battery pack is a power guarantee for a normal driving of the electric vehicle. In order to reduce the risk at the time of energy supply by the on-board battery pack, it is needed to design a special battery diagnosis circuit for detecting battery safety issues such as safety issues of the battery pack under high voltages, and specify a corresponding management strategy to deal with the safety issues under high voltages and thus ensure the safety performance of the on-board battery pack in the electric vehicle.

At present, in a battery detection circuit, the power battery pack and a sampling unit are usually set to not be connected to a common ground. Specifically, it means that positive and negative electrodes of the power battery pack are grounded at a high voltage, while the sampling unit is grounded at a low voltage. In order to isolate a high voltage ground signal of the power battery pack from interfering with a sampled signal of the sampling unit, an insulation unit may be additionally disposed behind the sampling unit.

However, the existing insulation unit may further introduce a new interference signal while isolating the high voltage ground signal of the power battery pack, resulting in a decrease in the accuracy of the sampled signal.

SUMMARY

The present disclosure provides a battery detection circuit and a battery management system.

According to an aspect of embodiments of the present disclosure, a battery detection circuit is provided. The battery detection circuit may include a positive relay, a negative relay, a first positive sampling unit, a first negative sampling unit, a second positive sampling unit, a second negative sampling unit, and a reference voltage terminal, wherein: a first terminal of the positive relay is connected to a positive electrode of a power battery pack to be detected, a first terminal of the negative relay is connected to a negative electrode of the power battery pack to be detected, and each of the first positive sampling unit, the first negative sampling unit, the second positive sampling unit, and the second negative sampling unit is connected to the reference voltage terminal; the first positive sampling unit is configured to acquire a first positive sampled signal of the power battery pack to be detected at the first terminal of the positive relay; the first negative sampling unit is configured to acquire a first negative sampled signal of the power battery pack to be detected at the first terminal of the negative relay; the second positive sampling unit is configured to acquire a second positive sampled signal of the power battery pack to be detected at a second terminal of the positive relay; and the second negative sampling unit is configured to acquire a second negative sampled signal of the power battery pack to be detected at a second terminal of the negative relay.

According to another aspect of embodiments of the present disclosure, a battery management system is provided. The battery management system may include the above-described battery detection circuit and a processor that is connected to the battery detection circuit. The processor may be configured to calculate a voltage at the first terminal of the positive relay based on the first positive sampled signal; calculate a voltage at the first terminal of the negative relay based on the first negative sampled signal; obtain a relay-input voltage of the power battery pack to be detected, based on the voltage at the first terminal of the positive relay and the voltage at the first terminal of the negative relay, wherein the relay-input voltage of the power battery pack to be detected is a voltage between the first terminal of the positive relay and the first terminal of the negative relay; calculate a voltage at the second terminal of the positive relay based on the second positive sampled signal; calculate a voltage at the second terminal of the negative relay based on the second negative sampled signal; and obtain a relay-output voltage of the power battery pack to be detected, based on the voltage at the second terminal of the positive relay and the voltage at the second terminal of the negative relay, wherein the relay-output voltage of the power battery pack to be detected is a voltage between the second terminal of the positive relay and the second terminal of the negative relay.

BRIEF DESCRIPTION OF THE DRAWINGS

To more clearly illustrate technical solutions of embodiments of the present disclosure, the accompanying drawings, which are to be referred by the embodiments of the present disclosure, will be briefly described. Those skilled in the art will be able to obtain additional drawings in accordance with these drawings without any creative work.

DETAILED DESCRIPTION

Various aspects of features and exemplary embodiments of the present disclosure will be described in detail below. The present disclosure will be provided in further detail below in conjunction with accompanying drawings and embodiments in order to make objects, technical solutions and advantages of the present disclosure to be more clearly understood. It is to be appreciated that the specific embodiments described herein are to be construed to illustrate the present disclosure but not to limit the present disclosure. It will be apparent to those skilled in the art that the present disclosure may be practiced without some of these specific details. The following description of the embodiments is merely to provide a better understanding of the present disclosure by illustrating examples thereof.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . . " do not preclude the presence of additional identical elements in the process, method, article or device that includes the elements.

In embodiments of the present disclosure, in terms of battery type, the battery pack to be detected may be a lithium ion battery, a lithium metal battery, a lead acid battery, a nickel cadmium battery, a nickel hydrogen battery, a lithium sulfur battery, a lithium air battery, or a sodium ion, which is not particularly limited in the embodiments of the present disclosure. In terms of battery scale, the battery pack to be detected may be a cell or a battery module or a battery pack, which is not particularly limited in the embodiments of the present disclosure.

With the battery detection circuit and the battery management system provided in the embodiments of the present disclosure, the battery management system may be integrated with an integral circuit implementing high voltage sampling, insulation detection and relay diagnosis, and thus the battery management system may have the functions of high voltage sampling, insulation detection and relay diagnosis.

For a better understanding of the present disclosure, the battery detection circuit according to embodiments of the present disclosure will be described in detail with reference to FIGS. 1, 2 and 3. It is to be noted that these embodiments are not intended to limit the scope of the present disclosure.

Figure 1:
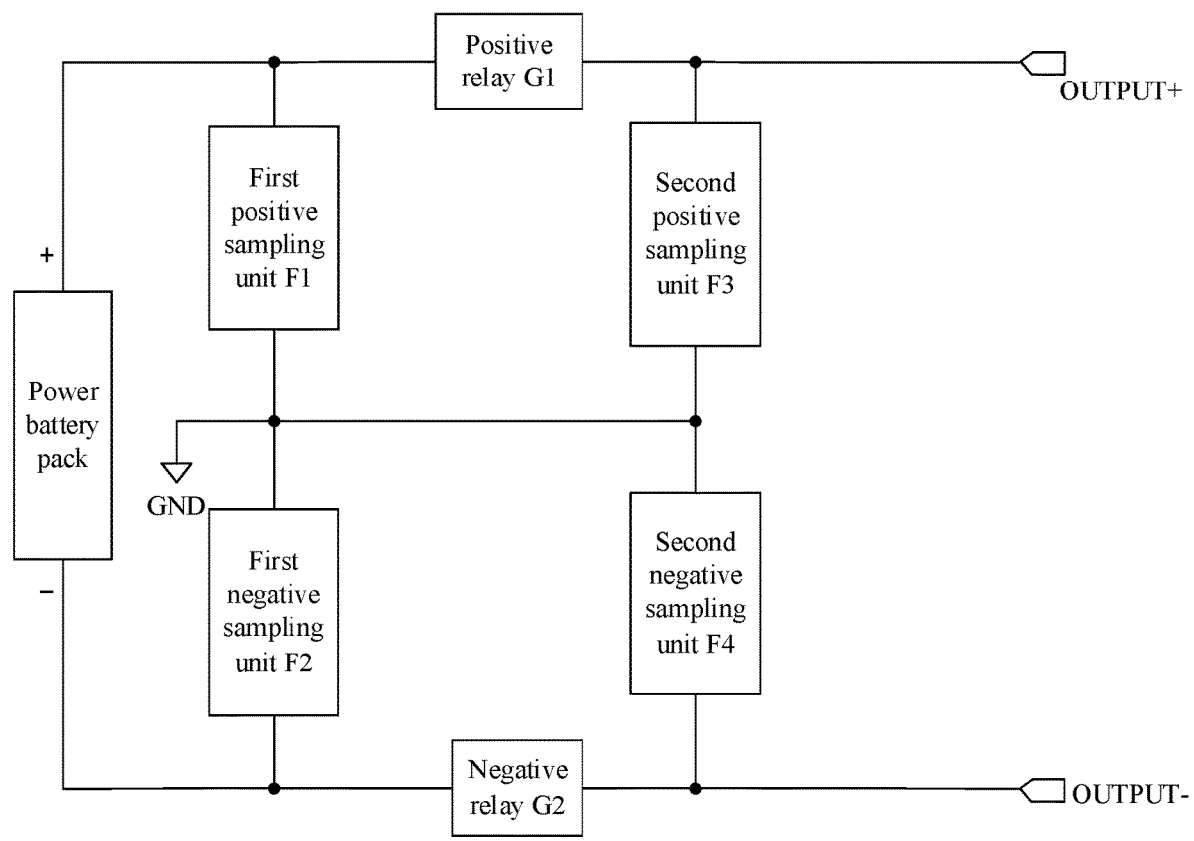
FIG. 1 is a schematic diagram showing a structure of a battery detection circuit according to an embodiment of the present disclosure.

FIG. 1 is a schematic diagram showing a structure of a battery detection circuit according to an embodiment of the present disclosure. As shown in FIG. 1, the battery detection circuit may include a positive relay G1, a negative relay G2, a first positive sampling unit F1, a first negative sampling unit F2, a second positive sampling unit F3, a second negative sampling unit F4, and a reference voltage terminal GND.

In the embodiment of the present disclosure, the positive relay may be connected to a positive electrode of a power battery pack to be detected; the negative relay may be connected to a negative electrode of the power battery pack to be detected; and each of the first positive sampling unit, the first negative sampling unit, the second positive sampling unit, and the second negative sampling unit may be connected to the reference voltage terminal.

Further, the first positive sampling unit may be configured to acquire a first positive sampled signal of the battery pack at a first terminal of the positive relay; the first negative sampling unit may be configured to acquire a first negative sampled signal of the battery pack at a first terminal of the negative relay; the second positive sampling unit may be configured to acquire a second positive sampled signal of the battery pack at a second terminal of the positive relay; the second negative sampling unit may be configured to acquire a second negative sampled signal of the battery pack at a second terminal of the negative relay.

In the embodiment, the sampling units and the battery pack to be detected may be connected to the same reference voltage terminal. In comparison to the case that the isolation unit needs to be additionally provided for the sampling unit when the sampling unit and the battery pack are connected to different reference voltage terminals, the structure of the circuit according to the embodiment can be simplified, and meanwhile, the new interference signal introduced by additionally providing the isolation unit can be avoided and thus the accuracy of the sampled signals can be improved.

Figure 2:
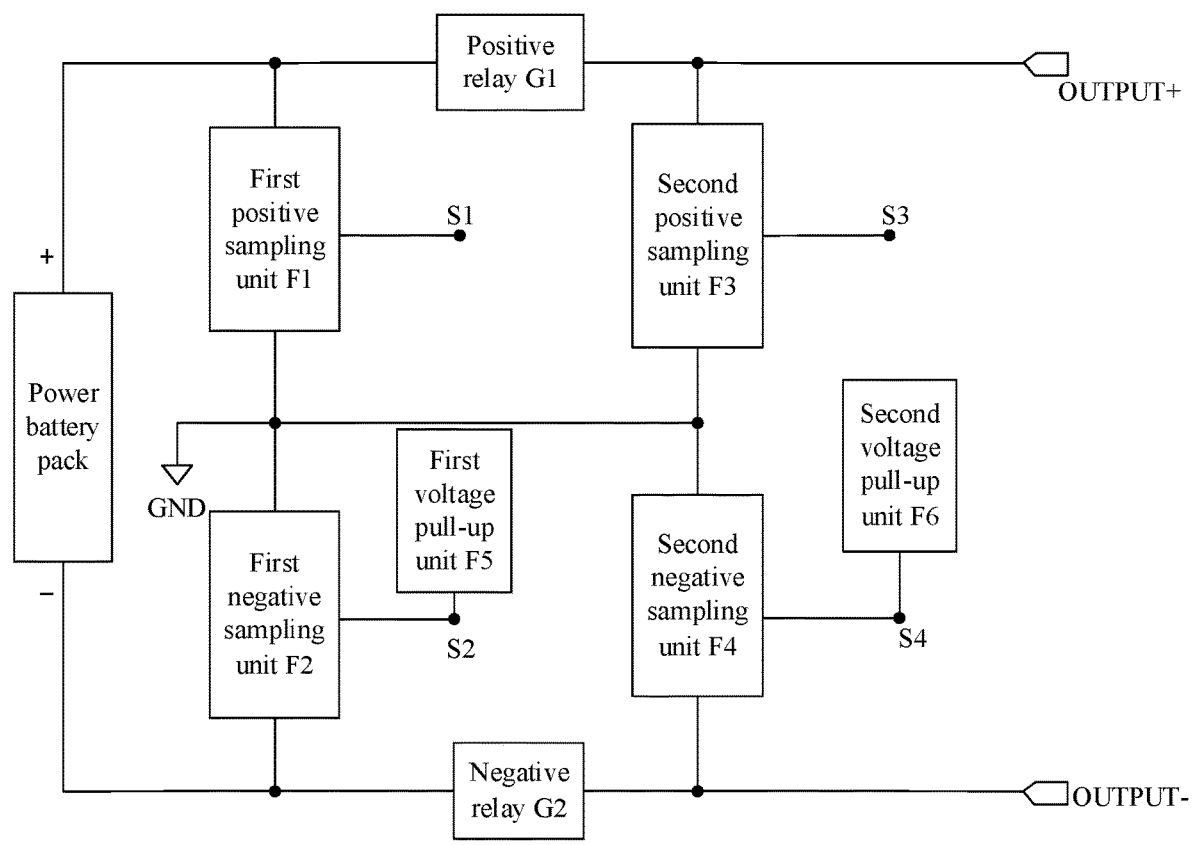
FIG. 2 is a schematic diagram showing a structure of a battery detection circuit according to another embodiment of the present disclosure.

Referring to FIG. 2, a battery detection circuit according to another embodiment of the present disclosure will be described below. FIG. 2 is a schematic diagram showing the structure of the battery detection circuit according to another embodiment of the present disclosure. As shown in FIG. 2, FIG. 2 differs from FIG. 1 in that, in some embodiments, the battery detection circuit may further include a first positive sampling point S1, a first negative sampling point S2, a second positive sampling point S3, a second negative sampling point S4, a first voltage pull-up unit F5, and a second voltage pull-up unit F6.

It is to be noted that the embodiments of the present disclosure are not limited to the description in the above embodiment and the specific units shown in FIG. 2. In some embodiments, the battery detection circuit may include only a portion of the units therein. That is, the battery detection circuit in the embodiments of the present disclosure may include a more flexible unit configuration, which will be described below in connection with specific embodiments.

In an embodiment, the battery detection circuit may further include the first positive sampling point, the first negative sampling point, the second positive sampling point, and the second negative sampling point.

In the embodiment, the first positive sampling unit may be further configured to provide the first positive sampled signal to the first positive sampling point; the first negative sampling unit may be further configured to provide the first negative sampled signal to the first negative sampling point; the second positive sampling unit may be further configured to provide the second positive sampled signal to the second positive sampling point; and the second negative sampling unit may be further configured to provide the second negative sampled signal to the second negative sampling point.

Continuing with reference to FIG. 2, in an embodiment, a terminal of the first positive sampling unit F1 may be connected to the first terminal of the positive relay G1 and the positive electrode of the battery pack to be detected; and the other terminal of the first positive sampling unit F1 may be connected to the first positive sampling point S1 and the reference voltage terminal GND.

A terminal of the first negative sampling unit F2 may be connected to the first terminal of the negative relay G2 and the negative electrode of the battery pack to be detected; and the other terminal of the first negative sampling unit F2 may be connected to the first negative sampling point S2 and the reference voltage terminal GND.

A terminal of the second positive sampling unit F3 may be connected to the second terminal of the positive relay G1; and the other terminal of the second positive sampling unit F3 may be connected to the second positive sampling point S3 and the reference voltage terminal GND.

A terminal of the second negative sampling unit F4 may be connected to the second terminal of the negative relay G2; and the other terminal of the second negative sampling unit F4 may be connected to the second negative sampling point S4 and the reference voltage terminal GND.

In the embodiment, an actual voltage at the reference voltage terminal GND may be set in accordance with working scene and demand of a high voltage sampling circuit. The voltage at the reference voltage terminal GND can be regarded as the reference voltage of the battery detection circuit in the embodiment. In other words, the reference voltage at the reference voltage terminal GND can be regarded as relative 0V.

As an example, if the actual voltage at the reference voltage terminal GND is 6V and the actual voltage of the sampled signal acquired at the first positive sampling point S1 is 22V, the reference voltage 6V can be recorded as 0V, and the voltage of the sampled signal acquired at the first positive sampling point S1 can be recorded as 16V.

In the battery detection circuit, the other terminal of the first positive sampling unit F1 may be connected to the first positive sampling point S1 and the reference voltage terminal GND; the other terminal of the first negative sampling unit F2 may be connected to the first negative sampling point S2 and the reference voltage terminal GND; the other terminal of the second positive sampling unit F3 may be connected to the second positive sampling point S3 and the reference voltage terminal GND; and the other terminal of the second negative sampling unit F4 may be connected to the second negative sampling point S4 and the reference voltage terminal GND.

In other words, all of a sampled voltage $U_{SP1}$ of the first positive sampled signal at the first positive sampling point S1, a sampled voltage $U_{SP2}$ of the first negative sampled signal at the first negative sampling point S2, a sampled voltage $U_{SP3}$ of the second positive sampled signal at the second positive sampling point S3 and a sampled voltage $U_{SP4}$ of the second negative sampled signal at the second negative sampling point S4 may share a same reference voltage.

As an example, the reference voltage terminal may be a low voltage ground.

When the reference voltage terminal GND is the low voltage ground, all of the first positive sampling unit F1, the first negative sampling unit F2, the second positive sampling unit F3, the second negative sampling unit F4 and the power battery pack to be detected may be connected to the common low voltage ground.

In the embodiments of the present disclosure, the voltages may be detected by the first positive sampling unit F1, the first negative sampling unit F2, the second positive sampling unit F3 and the second negative sampling unit F4. When these sampling units employ the same reference voltage (e.g. they are connected to the common low voltage ground), it is possible to avoid additionally providing the isolation unit for isolating the sampled signal due to the different reference voltage terminals, thereby simplifying the circuit structure, reducing the error caused by isolating the sampled signal, and thus improving the accuracy of the voltage of the sampled signal.

In some embodiments, when all of the above sampling units take the low voltage ground as a reference, both the sampled voltage $U_{SP2}$ of the first negative sampled signal at the first negative sampling point S2 and the sampled voltage $U_{SP4}$ of the second negative sampled signal at the second negative sampling point S4 may be lower than the voltage (i.e. relative 0V) at the reference voltage terminal GND because of the voltage drop of the current. In this case, both the sampled voltage $U_{SP2}$ and the sampled voltage $U_{SP4}$ may be recorded as a negative voltage.

Therefore, in some embodiments, it may be necessary to apply a voltage pull-up process to the sampled voltage $U_{SP2}$ of the first negative sampled signal at the first negative sampling point S2 and the sampled voltage $U_{SP4}$ of the second negative sampled signal at the second negative sampling point S4.

Continuing with reference to FIG. 2, in an embodiment, the battery detection circuit may further include the first voltage pull-up unit F5 and the second voltage pull-up unit F6.

The first voltage pull-up unit F5 may be connected to the first negative sampling point S2, and the first voltage pull-up unit F5 may be configured to pull up the first negative sampled signal to be a positive voltage signal.

The second voltage pull-up unit F6 may be connected to the second negative sampling point S4, and the second voltage pull-up unit F6 may be configured to pull up the second negative sampled signal to be a positive voltage signal.

In the embodiment, the voltage of the first negative sampled signal at the first negative sampling point S2 and the voltage of the second negative sampled signal at the second negative sampling point S4 are pulled up by a preset pull-up voltage value, so that both the output voltage $U_{SP2}$ of the first negative sampled signal at the first negative sampling point S2 and the output voltage $U_{SP4}$ of the second negative sampled signal at the second negative sampling point S4 may be higher than the voltage at the reference voltage terminal. That is, after the voltage pull-up process, both the voltage $U_{SP2}$ of the first negative sampled signal at the first negative sampling point S2 and the voltage $U_{SP4}$ of the second negative sampled signal at the second negative sampling point S4 may be recorded as a positive voltage.

The battery detection circuit according to the embodiment of the present disclosure may implement voltage sampling for a high voltage circuit, insulation detection for the power battery pack to be detected and relay diagnosis for the battery detection circuit, based on the first positive sampled signal acquired from the first positive sampling point S1, the first negative sampled signal acquired from the first negative sampling point S2, the second positive sampled signal acquired from the second positive sampling point S3 and the second negative sampled signal acquired from the second negative sampling point S4.

Next, referring to FIG. 3, a specific structure of the battery detection circuit according to an embodiment of the present disclosure will be described in detail with reference to specific embodiments.

Figure 3:
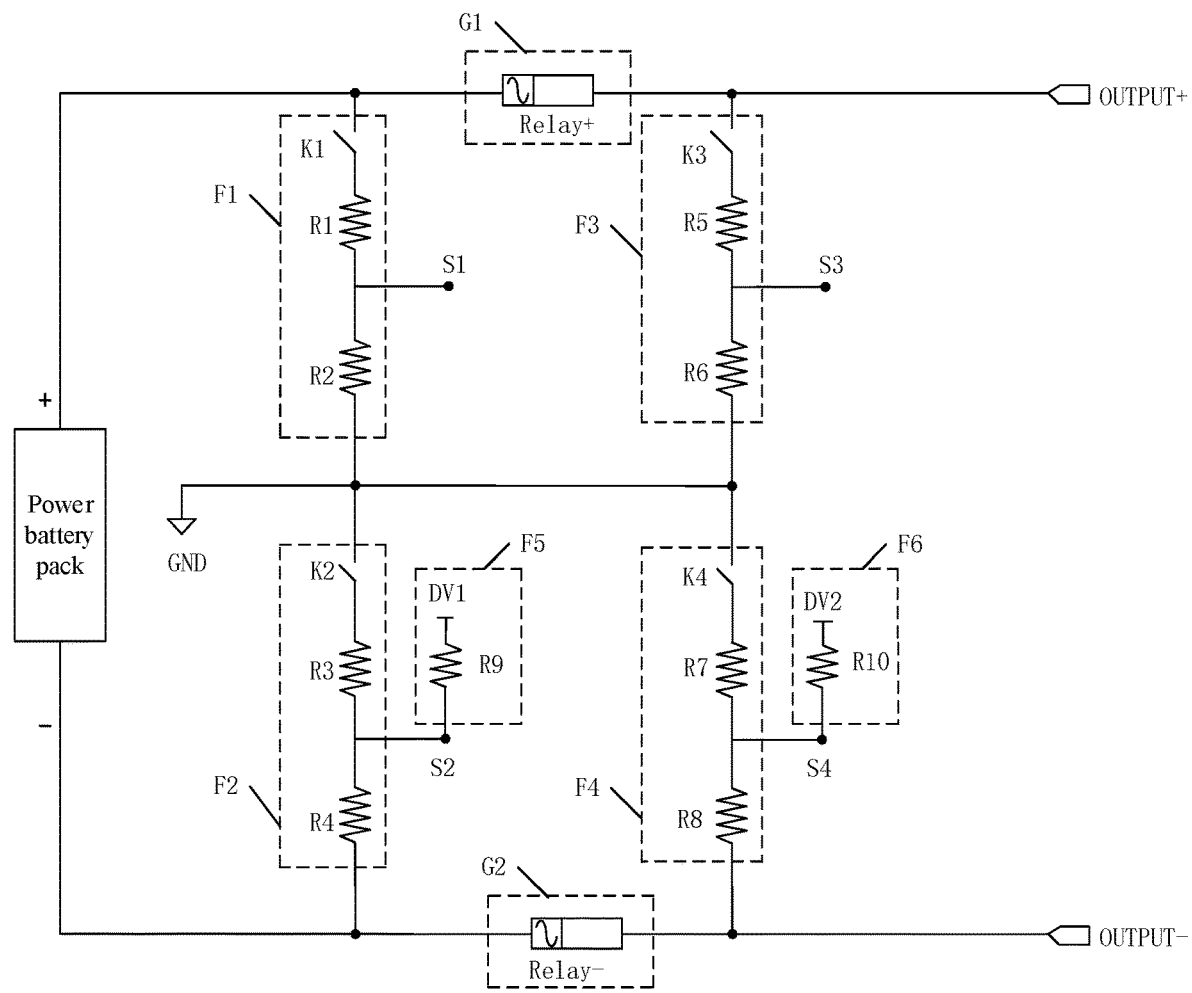
FIG. 3 is a circuit diagram of a battery detection circuit according to an exemplary embodiment of the present disclosure.

FIG. 3 is a schematic diagram showing a structure of a battery detection circuit according to an exemplary embodiment of the present disclosure. FIG. 3 schematically shows specific structures of the first positive sampling unit F1, the first negative sampling unit F2, the second positive sampling unit F3, the second negative sampling unit F4, the first voltage pull-up unit F5, and the second voltage pull-up unit F6.

As shown in FIG. 3, in an embodiment, the first positive sampling unit F1 may include a first resistor network R1 and a second resistor network R2 in series.

A terminal of the first resistor network R1 may be connected to the first terminal of the positive relay G1 and the positive electrode of the battery pack to be detected, and the other terminal of the first resistor network R1 may be connected to the first positive sampling point S1 and a terminal of the second resistor network R2.

The other terminal of the second resistor network R2 may be connected to the reference voltage terminal GND.

In an example, the resistor network form and the resistance value of the first resistor network R1 may be the same as the resistor network form and the resistance value of the second resistor network R2.

In the embodiment, the first resistor network R1 and the second resistor network R2 may function as a divider. The range of the first positive sampled signal at the first positive sampling point S1 can be adjusted by adjusting the resistance value of the first resistor network R1 and the resistance value of the second resistor network R2.

In an embodiment, the first negative sampling unit F2 may include a third resistor network R3 and a fourth resistor network R4 in series.

A terminal of the third resistor network R3 may be connected to the reference voltage terminal GND, and the other terminal of the third resistor network R3 may be connected to the first negative sampling point S2 and a terminal of the fourth resistor network R4.

The other terminal of the fourth resistor network R4 may be connected to the first terminal of the negative relay G2 and the negative electrode of the battery pack to be detected.

In an example, the resistor network form and the resistance value of the third resistor network R3 may be the same as the resistor network form and the resistance value of the fourth resistor network R4.

In the embodiment, the third resistor network R3 and the fourth resistor network R4 may function as a divider. The range of the first negative sampled signal at the first negative sampling point S2 can be adjusted by adjusting the resistance value of the third resistor network R3 and the resistance value of the fourth resistor network R4.

In an embodiment, the second positive sampling unit F3 may include a fifth resistor network R5 and a sixth resistor network R6 in series.

A terminal of the fifth resistor network R5 may be connected to the second terminal of the positive relay G1, and the other terminal of the fifth resistor network R5 may be connected to the second positive sampling point S3 and a terminal of the sixth resistor network R6.

The other terminal of the sixth resistor network R6 may be connected to the reference voltage terminal GND.

In some examples, the resistor network form and the resistance value of the fifth resistor network R5 may be the same as the resistor network form and the resistance value of the sixth resistor network R6.

In the embodiment, the fifth resistor network R5 and the sixth resistor network R6 may function as a divider. The range of the second positive sampled signal at the second positive sampling point S3 can be adjusted by adjusting the resistance value of the fifth resistor network R5 and the resistance value of the sixth resistor network R6.

In an embodiment, the second negative sampling unit F4 may include a seventh resistor network R7 and an eighth resistor network R8 in series.

A terminal of the seventh resistor network R7 may be connected to the reference voltage terminal GND, and the other terminal of the seventh resistor network R7 may be connected to the second negative sampling point S4 and a terminal of the eighth resistor network R8.

The other terminal of the eighth resistor network R8 may be connected to the second terminal of the negative relay G2.

In some examples, the resistor network form and the resistance value of the seventh resistor network R7 may be the same as the resistor network form and the resistance value of the eighth resistor network R8.

In the embodiment, the seventh resistor network R7 and the eighth resistor network R8 may function as a divider. The range of the second negative sampled signal at the second negative sampling point S4 can be adjusted by adjusting the resistance value of the seventh resistor network R7 and the resistance value of the eighth resistor network R8.

Continuing with reference to FIG. 3, in an embodiment, the first voltage pull-up unit F5 may further include a first DC (Direct Current) voltage source DV1 and a ninth resistor network R9. A terminal of the ninth resistor network R9 may be connected to the first negative sampling point S2, and the other terminal of the ninth resistor network R9 may be connected to the first DC voltage source DV1.

In the embodiment, the first DC voltage source DV1 may generate a pull-up voltage U1. U1 may be a preset value and U1 may be greater than the voltage at the reference voltage terminal GND.

In an embodiment, the second voltage pull-up unit F6 may further include a second DC voltage source DV2 and a tenth resistor network R10. A terminal of the tenth resistor network R10 may be connected to the second negative sampling point S4, and the other terminal of the tenth resistor network R10 may be connected to the second DC voltage source DV2.

In the embodiment, the second DC voltage source DV2 may generate a pull-up voltage U2. U2 may be a preset value and U2 may be greater than the voltage at the reference voltage terminal GND.

In an example, the pull-up voltage U1 and the pull-up voltage U2 can be set to have a same pull-up voltage value.

In the battery detection circuit shown in FIG. 3, each of the first resistor network R1 to the tenth resistor network R10 may include a single resistor. In some other embodiments, each of the first resistor network R1 to the tenth resistor network R10 may include two or more resistors in series and/or in parallel.

It is to be noted that the resistor network form and the resistance value of each of the first resistor network R1 to the tenth resistor network R10 may be set in the actual application scenario of the battery detection according to the actual situation.

As an example, the resistor network form and the resistance value of each of the first resistor network R1 to the tenth resistor network R10 may be determined based on the demanded sampling accuracy and sampling range for the high voltage sampling process conducted by the battery detection circuit, the sampling range limit and the achievable sampling accuracy of the sampling units in the above described embodiments of the battery detection circuit, the tolerance range of operating voltage of components in the battery detection circuit, and the like.

Continuing with reference to FIG. 3, in some embodiments, the first positive sampling unit F1 may further include a first switch K1. A terminal of the first resistor network R1 may be connected, via the first switch K1, to the positive electrode of the power battery pack to be detected.

In the embodiments, it is possible to control whether the first positive sampling point S1 provides the first positive sampled signal or not, by turning on or turning off the first switch K1. When the first switch K1 is turned on, the first positive sampling point S1 may provide the first positive sampled signal. When the first switch K1 is turned off, the first positive sampling point S1 may stop providing the first positive sampled signal.

In some embodiments, the first negative sampling unit F2 may further include a second switch K2. A terminal of the third resistor network R3 may be connected to the reference voltage terminal GND via the second switch K2.

In the embodiments, it is possible to control whether the first negative sampling point S2 provides the first negative sampled signal or not, by turning on or turning off the second switch K2. When the second switch K2 is turned on, the first negative sampling point S2 may provide the first negative sampled signal. When the second switch K2 is turned off, the first negative sampling point S2 may stop providing the first negative sampled signal.

In some embodiments, the second positive sampling unit F3 may further include a third switch K3. A terminal of the fifth resistor network R5 may be connected to the second terminal of the positive relay G1 via the third switch K3.

In the embodiments, it is possible to control whether the second positive sampling point S3 provides the second positive sampled signal or not, by turning on or turning off the third switch K3. When the third switch K3 is turned on, the second positive sampling point S3 may provide the second positive sampled signal. When the third switch K3 is turned off, the second positive sampling point S3 may stop providing the second positive sampled signal.

In some embodiments, the second negative sampling unit F4 may further include a fourth switch K4. A terminal of the seventh resistor network R7 may be connected to the reference voltage terminal GND via the fourth switch K4.

In the embodiments, it is possible to control whether the second negative sampling point S4 provides the second negative sampled signal or not, by turning on or turning off the fourth switch K4. When the fourth switch K4 is turned on, the second negative sampling point S4 may provide the second negative sampled signal. When the fourth switch K4 is turned off, the second negative sampling point S4 may stop providing the second negative sampled signal.

In some embodiments, each of the first positive sampling point S1, the first negative sampling point S2, the second positive sampling point S3 and the second negative sampling point S4 may be connected to a sampling unit for implementing the sampling process. In an example, the sampling unit may be an Analog to Digital Converter (ADC).

As an example, the ADC 1 may be connected to the first positive sampling point S1 via a sampling line SP1 to acquire the voltage on the second resistor network through the first positive sampled signal supplied from the first positive sampling point S1.

As an example, the ADC 2 may be connected to the first negative sampling point S2 via a sampling line SP2 to acquire the voltage on the third resistor network through the first negative sampled signal supplied from the first negative sampling point S2.

As an example, the ADC 3 may be connected to the second positive sampling point S3 via a sampling line SP3 to acquire the voltage on the sixth resistor network through the second positive sampled signal supplied from the second positive sampling point S3.

As an example, the ADC 4 may be connected to the second negative sampling point S4 via a sampling line SP4 to acquire the voltage on the seventh resistor network through the second negative sampled signal supplied from the second negative sampling point S4.

The battery detection circuit according to the embodiment of the present disclosure may provide an integral circuitry to implement the high voltage sampling, the insulation detection and the relay diagnosis. With such a battery detection circuit, it is possible to acquire the voltage of the battery pack, detect an insulation resistance value of the battery pack and diagnose whether the relay has failed. The structure of the circuit may be simplified and the cost of the circuit may be reduced.

In the battery detection circuit according to some embodiments of the present disclosure, the battery to be detected and each of the first positive sampling unit F1, the first negative sampling unit F2, the second positive sampling unit F3 and the second negative sampling unit F4 may be connected to a common ground. Thus it is not needed to additionally provide the isolation unit for isolating the sampled signal, thereby simplifying the circuit structure, reducing the error caused by isolating the sampled signal, and thus improving the accuracy of the voltage of the sampled signal.

Figure 4:
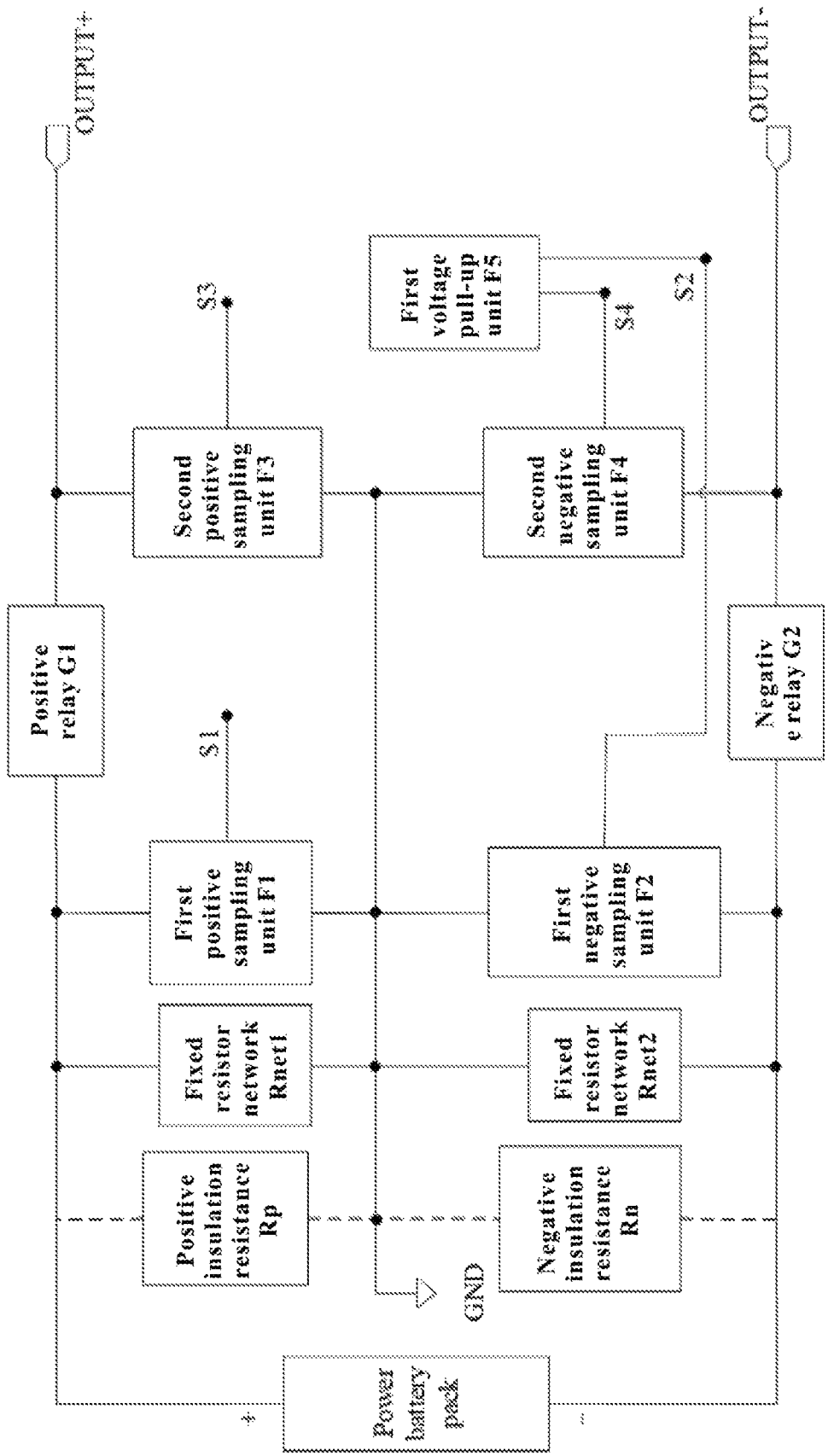
FIG. 4 is a schematic diagram showing a structure of a battery detection circuit according to a further embodiment of the present disclosure.
Figure 5:
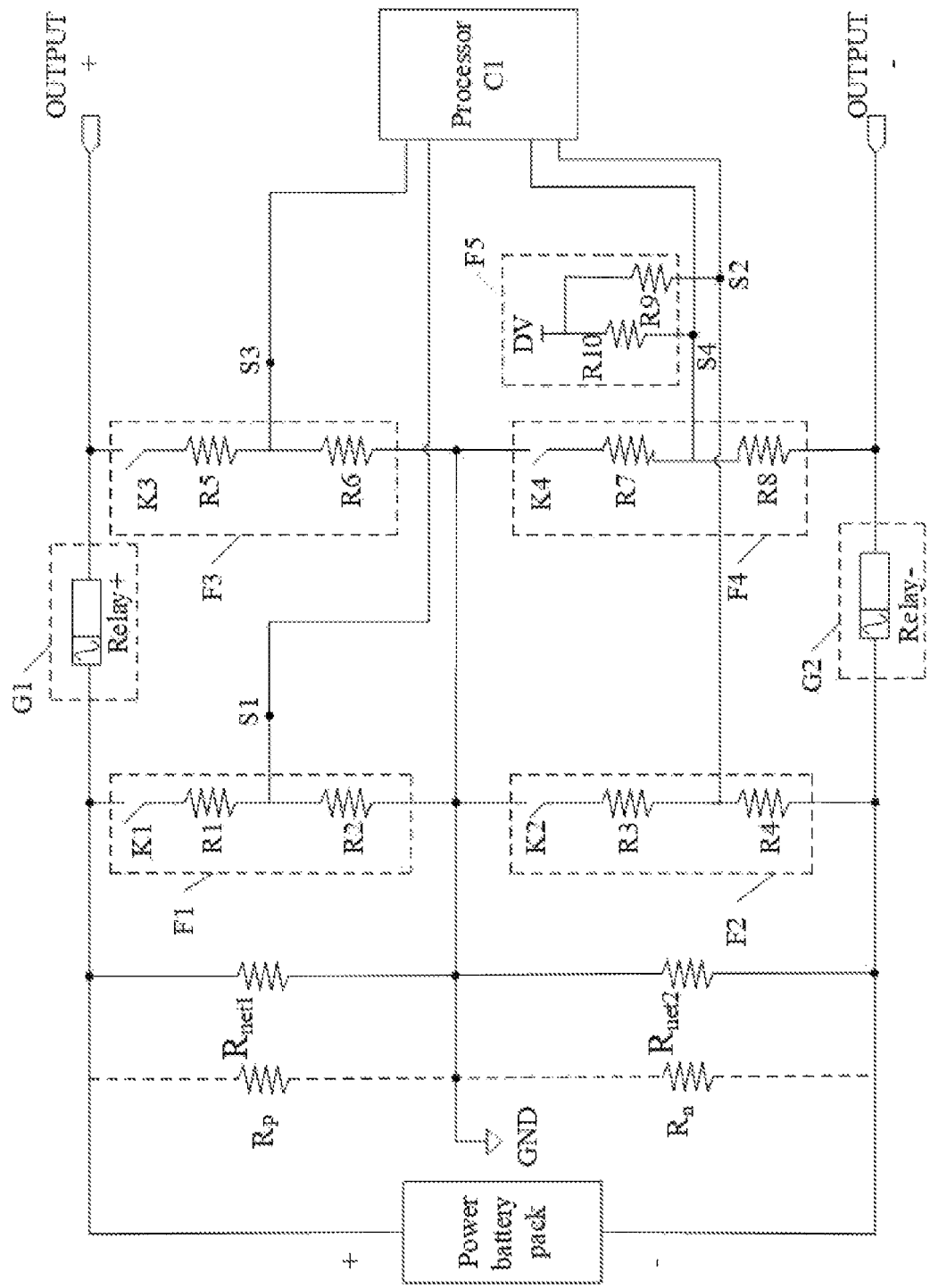
FIG. 5 is a circuit diagram of a battery detection circuit according to a further exemplary embodiment of the present disclosure.

Referring to FIG. 4 and FIG. 5, a battery detection circuit according to a further embodiment of the present disclosure will be described below. FIG. 4 is a schematic diagram showing a structure of the battery detection circuit according to the further embodiment of the present disclosure. In both FIG. 4 and FIG. 2, a same reference number may indicate a same element. The battery detection circuit shown in FIG. 4 is almost the same as the battery detection circuit shown in FIG. 2 and only has the following differences.

As shown in FIG. 4, in some embodiments, the first negative sampling unit F2 and the second negative sampling unit F4 may be connected to the voltage pull-up unit F7. The voltage pull-up unit F7 may pull up the sampled voltage of the first negative sampled signal and the sample voltage of the second negative sampled signal to be a positive voltage signal.

Continuing with reference to FIG. 4, in some embodiments, the battery detection circuit may further include a first fixed resistor network $R_{net1}$. A first terminal of the first fixed resistor network $R_{net1}$ may be connected to the positive electrode of the power battery pack to be detected. A second terminal of the first fixed resistor network $R_{net1}$ may be connected to the reference voltage terminal GND.

In an embodiment, the battery management system may further include a second fixed resistor network $R_{net2}$. A first terminal of the second fixed resistor network $R_{net2}$ may be connected to the negative electrode of the power battery pack to be detected. A second terminal of the second fixed resistor network $R_{net2}$ may be connected to the reference voltage terminal GND.

In another embodiment, the battery management system may include both the first fixed resistor network $R_{net1}$ and the second fixed resistor network $R_{net2}$.

FIG. 4 also schematically shows positions of a positive insulation resistance and a negative insulation resistance of the power battery pack to be detected in the circuit diagram of the battery detection circuit. In the figure, $R_p$ indicates the positive insulation resistance of the power battery pack, and $R_n$ indicates the negative insulation resistance of the power battery pack.

As shown by the dotted line in FIG. 4, a terminal of $R_p$ may be connected to the positive electrode of the power battery pack to be detected, and the other terminal of $R_p$ may be connected to the reference voltage terminal GND; a terminal of $R_n$ may be connected to the reference voltage terminal GND, and the other terminal of $R_n$ may be connected to the negative electrode of the power battery pack to be detected.

FIG. 5 is a circuit diagram of the battery detection circuit according to the further exemplary embodiment of the present disclosure. FIG. 5 schematically shows specific structures of the first positive sampling unit F1, the first negative sampling unit F2, the second positive sampling unit F3, the second negative sampling unit F4, the voltage pull-up unit F7, the first fixed resistor network $R_{net1}$ and the second fixed resistor network $R_{net2}$.

As shown in FIG. 5, in an embodiment, the voltage pull-up unit may include a DC voltage source DV, the ninth resistor network R9 and the tenth resistor network R10.

A terminal of the ninth resistor network R9 may be connected to the first negative sampling point S2, and the other terminal of the ninth resistor network R9 may be connected to the DC voltage source DV.

In the embodiment, the DC voltage source DV and the ninth resistor network R9 may generate the pull-up voltage U1. U1 may be a preset value and U1 may be greater than the voltage at the reference voltage terminal GND.

Continuing with reference to FIG. 5, in an embodiment, a terminal of the tenth resistor network R10 may be connected to the second negative sampling point S4, and the other terminal of the tenth resistor network R10 may be connected to the DC voltage source DV.

In the embodiment, the DC voltage source DV and the tenth resistor network R10 may generate the pull-up voltage U2. U2 may be a preset value and U2 may be greater than the voltage at the reference voltage terminal GND.

In an example, the pull-up voltage U1 and the pull-up voltage U2 can be set to have a same pull-up voltage value.

In some embodiments, each of the sampled voltage of the first negative sampled signal and the sampled voltage of the second negative sampled signal may be pulled up to be a positive voltage signal via the voltage pull-up unit F7 according to the embodiments of the present disclosure.

Continuing with reference to FIG. 5, in some embodiments, each of the first fixed resistor network $R_{net1}$ and the second fixed resistor network $R_{net2}$ may include a single resistor. In some other embodiments, each of the first fixed resistor network $R_{net1}$ and the second fixed resistor network $R_{net2}$ may include two or more resistors in series and/or in parallel.

In some examples, the resistor network form and the resistance value of the first fixed resistor network $R_{net1}$ may be the same as the resistor network form and the resistance value of the second fixed resistor network $R_{net2}$.

FIG. 5 also schematically shows positions of the positive insulation resistance and the negative insulation resistance of the power battery pack to be detected in the circuit diagram of the battery detection circuit. In the figure, $R_p$ indicates the positive insulation resistance of the power battery pack, and $R_n$ indicates the negative insulation resistance of the power battery pack.

As shown by the dotted line in FIG. 5, a terminal of the positive insulation resistance $R_p$ may be connected to the positive electrode of the power battery pack to be detected, and the other terminal of $R_p$ may be connected to the reference voltage terminal GND; a terminal of the negative insulation resistance $R_n$ may be connected to the reference voltage terminal GND, and the other terminal of $R_n$ may be connected to the negative electrode of the power battery pack to be detected.

Figure 6:
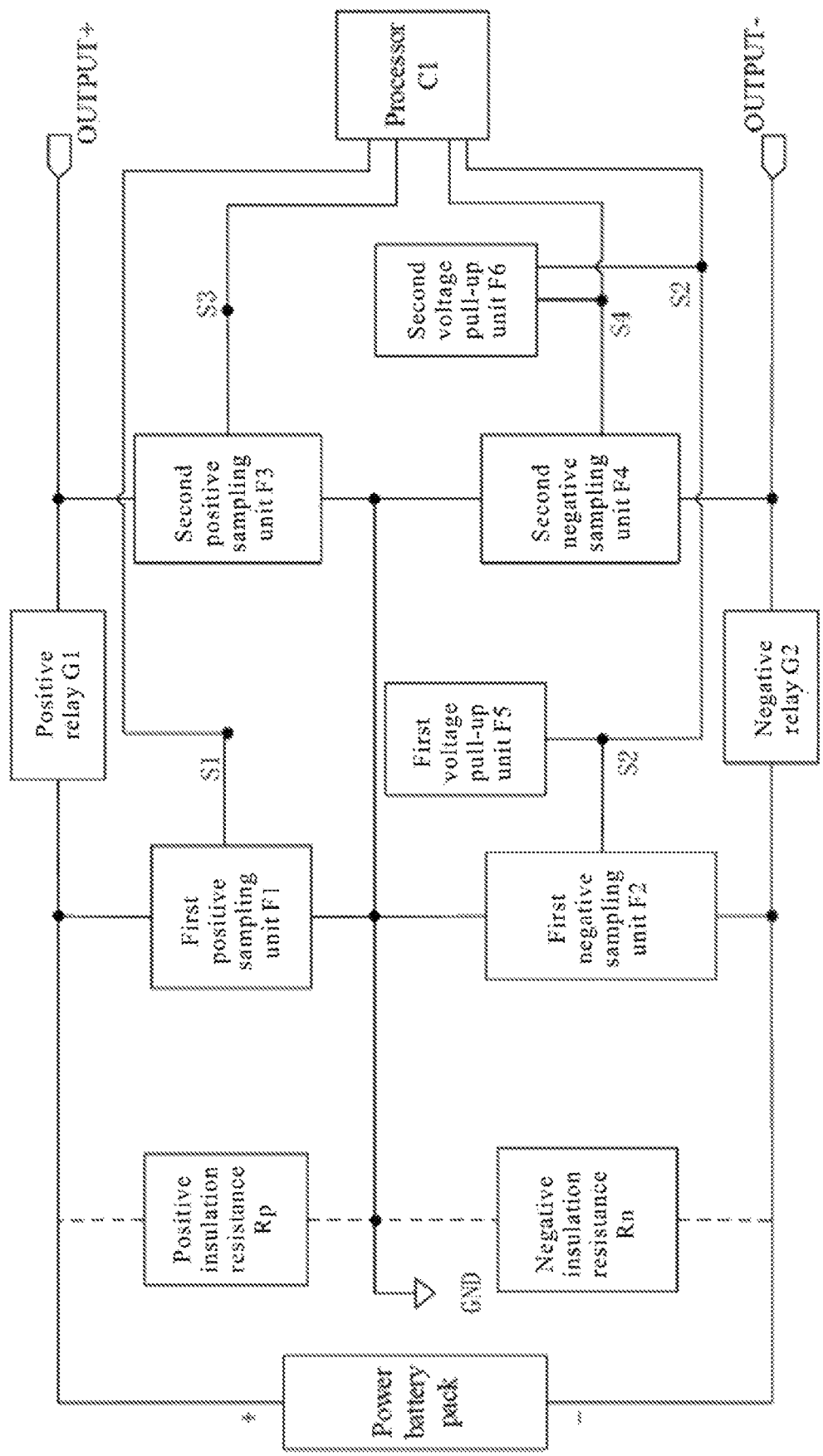
FIG. 6 is a schematic diagram showing a structure of a battery management system according to an embodiment of the present disclosure.
Figure 7:
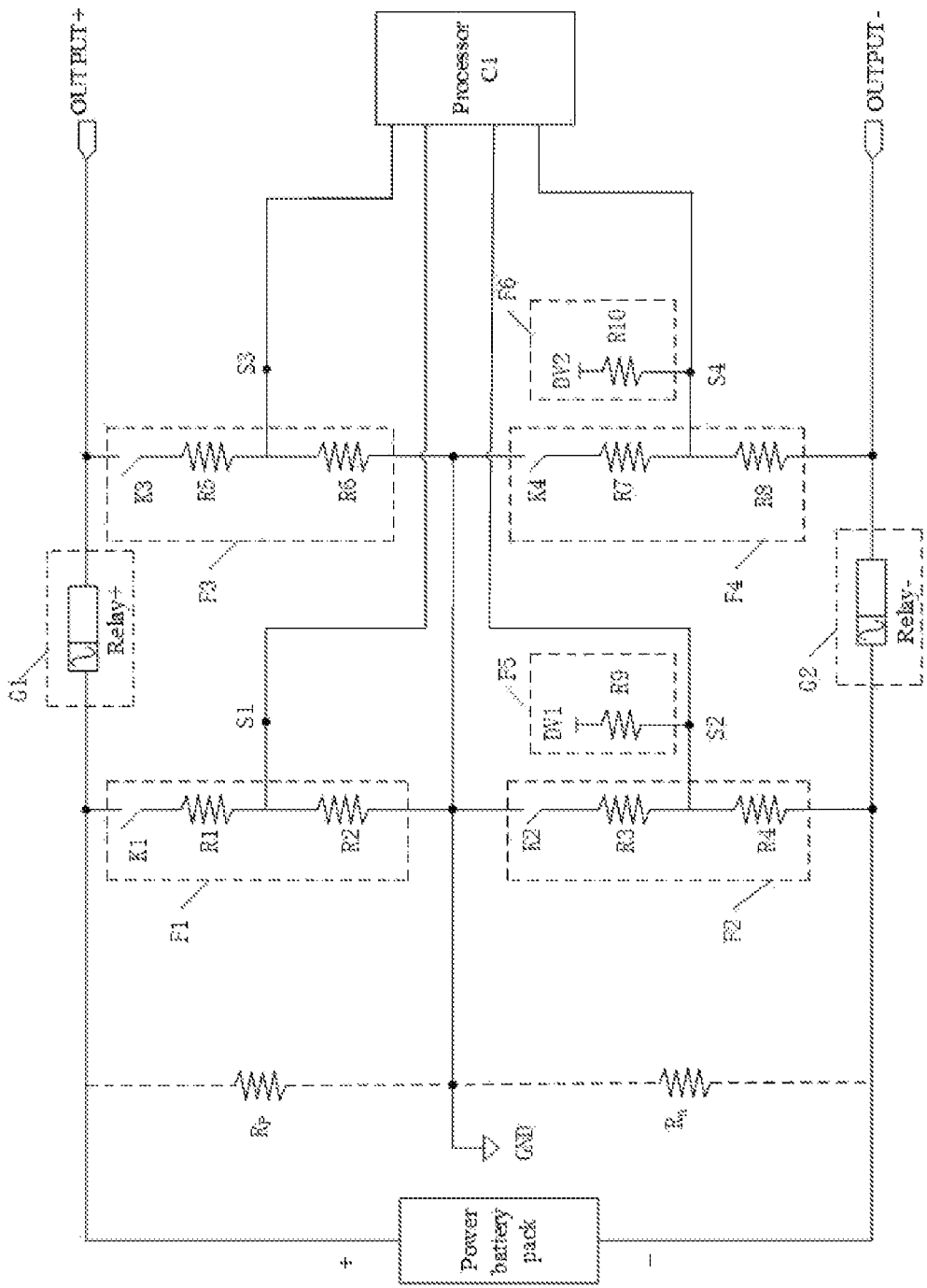
FIG. 7 is a circuit diagram of a battery management system according to an embodiment of the present disclosure.

Referring to FIG. 6 and FIG. 7, a battery management system according to an embodiment of the present disclosure will be described in detail below.

FIG. 6 is a schematic diagram showing a structure of the battery management system in an embodiment. As shown in FIG. 6, the battery management system may include the battery detection circuit in the above embodiments and a processor C1 that is connected to the battery detection circuit.

FIG. 6 also schematically shows positions of the positive insulation resistance and the negative insulation resistance of the power battery pack to be detected in the circuit diagram of the battery detection circuit.

As shown by the dotted line in FIG. 6, a terminal of $R_p$ may be connected to the positive electrode of the power battery pack to be detected, and the other terminal of $R_p$ may be connected to the reference voltage terminal GND; a terminal of $R_n$ may be connected to the reference voltage terminal GND, and the other terminal of $R_n$ may be connected to the negative electrode of the power battery pack to be detected.

In some embodiments, the processor C1 in the battery management system may be directly connected to the first positive sampling point S1, the first negative sampling point S2, the second positive sampling point S3, and the second negative sampling point S4.

In the embodiments, the processor C1 may have the function of converting each of the first positive sampled signal, the first negative sampled signal, the second positive sampled signal, and the second negative sampled signal to a digital signal.

In some other embodiments, the battery management system may further include an ADC 1. A terminal of the ADC 1 may be connected to the first positive sampling point S1, and the other terminal of the ADC 1 may be connected to the processor C1. The ADC 1 may be configured to convert the first positive sampled signal into a digital signal.

In some embodiments, the battery management system may further include an ADC 2. A terminal of the ADC 2 may be connected to the first negative sampling point S2, and the other terminal of the ADC 2 may be connected to the processor C1. The ADC 2 may be configured to convert the first negative sampled signal into a digital signal.

In some embodiments, the battery management system may further include an ADC 3. A terminal of the ADC 3 may be connected to the second positive sampling point S3, and the other terminal of the ADC 3 may be connected to the processor C1. The ADC 3 may be configured to convert the second positive sampled signal into a digital signal.

In some embodiments, the battery management system may further include an ADC 4. A terminal of the ADC 4 may be connected to the second negative sampling point S4, and the other terminal of the ADC 4 may be connected to the processor C1. The ADC 4 may be configured to convert the second negative sampled signal into a digital signal.

In some embodiments, the ADC 1, the ADC 2, the ADC 3 and the ADC 4 may be connected to the processor C1, so that the processor C1 may operate according to each of the digital signal of the positive sampled signal, the digital signal of the first negative sampled signal, the digital signal of the second positive sampled signal, and the digital signal of the second negative sampled signal.

Based on the first positive sampled signal, the first negative sampled signal, the second positive sampled signal, and the second negative sampled signal, the battery management system according to the embodiment may implement the high voltage sampling process for the power battery pack, detect the insulation resistance value of the power battery pack and diagnose whether the relay has failed.

In the embodiment of the present disclosure, the voltage between the first terminal of the positive relay G1 and the first terminal of the negative relay G2 may be referred to as a relay-input voltage of the power battery pack to be detected, and the voltage between the second terminal of the positive relay G1 and the second terminal of the negative relay G2 may be referred to as a relay-output voltage of the power battery pack to be detected.

In some embodiments, the processor C1 may calculate the relay-input voltage and the relay-output voltage of the power battery pack to be detected, based on the first positive sampled signal, the first negative sampled signal, the second positive sampled signal, and the second negative sampled signal.

Next, a method of implementing the high voltage sampling for the power battery pack by the battery management system according to the embodiments of the present disclosure and steps thereof will be described in detail in the following specific embodiment by referring to FIG. 7.

In FIG. 7, when the K1 is turned on, the K2 is turned on, the K3 is turned off and the K4 is turned off, the high voltage sampling may be implemented as follows.

The first positive sampling point S1 may provide the first positive sampled signal; the first negative sampling point S2 may provide the first negative sampled signal; the second positive sampling point S3 may stop providing the second positive sampled signal; and the second negative sampling point S4 may stop providing the second negative sampled signal.

The processor C1 may calculate the voltage at the first terminal of the positive relay G1 based on the first positive sampled signal, which is the voltage of the power battery pack at the first terminal of the positive relay G1. The voltage may also be referred to as a positive-terminal-relay-input voltage of the power battery pack.

The processor C1 may calculate the voltage at the first terminal of the negative relay G2 based on the first negative sampled signal, which is the voltage of the power battery pack at the first terminal of the negative relay G2. The voltage may also be referred to as a negative-terminal-relay-input voltage of the power battery pack.

The processor C1 may calculate the relay-input voltage of the power battery pack, based on the voltage at the first terminal of the positive relay G1 and the voltage at the first terminal of the negative relay G2.

In other words, the processor C1 may calculate the relay-input voltage of the power battery pack, based on the positive-terminal-relay-input voltage and the negative-terminal-relay-input voltage of the power battery pack.

Particularly, the sampled voltage $U_{sp1}$ of the first positive sampled signal may be obtained from the first positive sampled signal supplied from the first positive sampling point S1. Based on the sampled voltage $U_{sp1}$ of the first positive sampled signal, the first resistor network R1 and the second resistor network R2 in series, the voltage of the power battery pack at the first terminal of the positive relay G1 (i.e. the positive-terminal-relay-input voltage of the power battery pack) may be calculated according to the Ohm's Law.

Particularly, the sampled voltage $U_{sp2}$ of the first negative sampled signal may be obtained from the first negative sampled signal supplied from the first negative sampling point S2. Based on the sampled voltage $U_{sp2}$ of the first negative sampled signal, the third resistor network R3 and the fourth resistor network R4 in series, the voltage of the power battery pack at the first terminal of the negative relay G2 (i.e. the negative-terminal-relay-input voltage of the power battery pack) may be calculated according to the Ohm's Law.

The relay-input voltage of the power battery pack may be obtained by calculating a sum of the positive-terminal-relay-input voltage of the power battery pack and the negative-terminal-relay-input voltage of the power battery pack.

In FIG. 7, when the K1 is turned off, the K2 is turned off, the K3 is turned on and the K4 is turned on, the high voltage sampling may be implemented as follows.

The first positive sampling point S1 may stop providing the first positive sampled signal; the first negative sampling point S2 may stop providing the first negative sampled signal; the second positive sampling point S3 may provide the second positive sampled signal; and the second negative sampling point S4 may provide the second negative sampled signal.

The processor C1 may calculate the voltage at the second terminal of the positive relay G1 based on the second positive sampled signal, which is the voltage of the power battery pack at the second terminal of the positive relay G1. The voltage may also be referred to as a positive-terminal-relay-output voltage of the power battery pack.

The processor C1 may calculate the voltage at the second terminal of the negative relay G2 based on the second negative sampled signal, which is the voltage of the power battery pack at the second terminal of the negative relay G2. The voltage may also be referred to as a negative-terminal-relay-output voltage of the power battery pack.

The processor C1 may calculate the relay-output voltage of the power battery pack, based on the voltage at the second terminal of the positive relay G1 and the voltage at the second terminal of the negative relay G2.

In other words, the processor C1 may calculate the relay-output voltage of the power battery pack, based on the positive-terminal-relay-output voltage and the negative-terminal-relay-output voltage of the power battery pack.

Particularly, the sampled voltage $U_{sp3}$ of the second positive sampled signal may be obtained from the second positive sampled signal supplied from the second positive sampling point S3. Based on the sampled voltage $U_{sp3}$ of the second positive sampled signal, the fifth resistor network R5 and the sixth resistor network R6 in series, the voltage of the power battery pack at the second terminal of the positive relay G1 (i.e. the positive-terminal-relay-output voltage of the power battery pack) may be calculated according to the Ohm's Law.

Particularly, the sampled voltage $U_{sp4}$ of the second negative sampled signal may be obtained from the second negative sampled signal supplied from the second negative sampling point S4. Based on the sampled voltage $U_{sp4}$ of the second negative sampled signal, the seventh resistor network R7 and the eighth resistor network R8 in series, the voltage of the power battery pack at the second terminal of the negative relay G2 (i.e. the negative-terminal-relay-output voltage of the power battery pack) may be calculated according to the Ohm's Law.

The relay-output voltage of the power battery pack may be obtained by calculating a sum of the positive-terminal-relay-output voltage of the power battery pack and the negative-terminal-relay-output voltage of the power battery pack.

In the embodiment, as the battery management system is operating, the battery detection circuit of the embodiment may be utilized to calculate the relay-input voltage and the relay-output voltage of the power battery pack based on the sampled voltage $U_{sp1}$, the sampled voltage $U_{sp2}$, the sampled voltage $U_{sp3}$, and the sampled voltage $U_{sp4}$, so as to implement the high voltage sampling.

Continuing with reference to FIG. 7, a method of diagnosing the positive relay and the negative relay of the power battery pack by the battery management system according to the embodiments of the present disclosure and steps thereof will be described in detail in the following specific embodiments.

In the embodiments of the present disclosure, an absolute value of a difference between the voltage at the first terminal of the positive relay G1 and the voltage of the second terminal of the positive relay G1 may be compared with a voltage threshold of the positive relay G1, to obtain a comparison result for determining an operating state of the positive relay G1.

In particular, with the above method and the steps thereof to implement the high voltage sampling for the power battery pack by the battery detection circuit, the voltage at the first terminal of the positive relay G1 (i.e. the positive-terminal-relay-input voltage $U_{B+\ (input)}$ of the power battery pack) and the voltage at the second terminal of the positive relay G1 (i.e. the positive-terminal-relay-output voltage $U_{B+\ (output)}$ of the power battery pack) may be obtained.

In an embodiment, when the positive relay G1 is controlled to be turned on, if $U_{B+\ (input)}$ and $U_{B+\ (output)}$ satisfy the following Formula (1), it may be determined that the positive relay G1 is in a normal operating state.

$$|U_{B+(input)}-U_{B+(output)}|\leq U_{relay+} \quad (1)$$

In the above Formula (1), $U_{relay+}$ is a preset voltage drop of the relay coil at a positive terminal of the power battery pack to be detected.

According to the above Formula (1), when the positive relay G1 is controlled to be turned on, if the absolute value of the difference between the voltage at the first terminal of the positive relay G1 and the voltage of the second terminal of the positive relay G1 is smaller than or equals to the preset voltage drop of the relay coil at the positive terminal of the power battery pack, it may be determined that the positive relay G1 is in the normal operating state.

When the positive relay G1 is controlled to be turned on, if $U_{B+\ (input)}$ and $U_{B+\ (output)}$ satisfy the following Formula (2), it may be determined that the positive relay G1 has failed.

$$|U_{B+(input)}-U_{B+(output)}|>U_{relay+} \quad (2)$$

According to the above Formula (2), when the positive relay G1 is controlled to be turned on, if the absolute value of the difference between the voltage at the first terminal of the positive relay G1 and the voltage of the second terminal of the positive relay G1 is larger than the preset voltage drop of the relay coil at the positive terminal of the power battery pack, it may be determined that the positive relay G1 has failed.

Further, when the positive relay G1 is controlled to be turned on, if $U_{B+\ (input)}$ and $U_{B+\ (output)}$ satisfy the above Formula (2) and $U_{B+\ (output)}=0$, it may be determined that the positive relay G1 has failed and is in an open circuit state.

In another embodiment, when the positive relay G1 is controlled to be turned off, if $U_{B+\ (input)}$ and $U_{B+\ (output)}$ satisfy the above Formula (1), it may be determined that the positive relay G1 has failed and is in an adhesion state.

In the embodiment, when the positive relay G1 is controlled to be turned off, if $U_{B+\ (input)}$ and $U_{B+\ (output)}$ satisfy the above Formula (2) and $U_{B+\ (output)}=0$, it may be determined that the positive relay G1 is in the normal operating state.

In the embodiments of the present disclosure, an absolute value of a difference between the voltage at the first terminal of the negative relay G2 and the voltage of the second terminal of the negative relay G2 may be compared with a voltage threshold of the negative relay G2, to obtain a comparison result for determining an operating state of the negative relay G2.

In particular, with the above method and the steps thereof to implement the high voltage sampling for the power battery pack by the battery detection circuit, the voltage at the first terminal of the negative relay G2 (i.e. the negative-terminal-relay-input voltage $U_{B-\ (input)}$ of the power battery pack) and the voltage at the second terminal of the negative relay G2 (i.e. the negative-terminal-relay-output voltage $U_{B-\ (output)}$ of the power battery pack) may be obtained.

In an embodiment, when the negative relay G2 is controlled to be turned on, if $U_{B-\ (input)}$ and $U_{B-\ (output)}$ satisfy the following Formula (3), it may be determined that the negative relay G2 is in a normal operating state.

$$|U_{B-(input)}-U_{B-(output)}|\leq U_{relay-} \quad (3)$$

In the above Formula (3), $U_{relay-}$ is a preset voltage drop of the relay coil at a negative terminal of the power battery pack to be detected.

According to the above Formula (3), when the negative relay G2 is controlled to be turned on, if the absolute value of the difference between the voltage at the first terminal of the negative relay G2 and the voltage of the second terminal of the negative relay G2 is smaller than or equals to the preset voltage drop of the relay coil at the negative terminal of the power battery pack, it may be determined that the negative relay G2 is in the normal operating state.

When the negative relay G2 is controlled to be turned on, if $U_{B-\ (input)}$ and $U_{B-\ (output)}$ satisfy the following Formula (4), it may be determined that the negative relay G2 has failed.

$$|U_{B-(input)}-U_{B-(output)}|>U_{relay-} \quad (4)$$

According to the above Formula (4), when the negative relay G2 is controlled to be turned on, if the absolute value of the difference between the voltage at the first terminal of the negative relay G2 and the voltage of the second terminal of the negative relay G2 is larger than the preset voltage drop of the relay coil at the negative terminal of the power battery pack, it may be determined that the negative relay G2 has failed.

Further, when the negative relay G2 is controlled to be turned on, if $U_{B-\ (input)}$ and $U_{B-\ (output)}$ satisfy the above Formula (4) and $U_{B-\ (output)}=0$, it may be determined that the negative relay G2 has failed and is in an open circuit state.

In another embodiment, when the negative relay G2 is controlled to be turned off, if $U_{B-\ (input)}$ and $U_{B-\ (output)}$ satisfy the above Formula (3), it may be determined that the negative relay G2 has failed and is in an adhesion state.

In the embodiment, when the negative relay G2 is controlled to be turned off, if $U_{B-\ (input)}$ and $U_{B-\ (output)}$ satisfy the above Formula (4) and $U_{B-\ (output)}=0$, it may be determined that the negative relay G2 is in the normal operating state.

In the embodiments, the operating state of the relay coil at the positive terminal of the power battery pack can be diagnosed according to the positive-terminal-relay-input voltage and the positive-terminal-relay-output voltage of the power battery pack obtained in the high voltage sampling process and the preset voltage drop of the relay coil at the positive terminal of the power battery pack; and the operating state of the relay coil at the negative terminal of the power battery pack can be diagnosed according to the negative-terminal-relay-input voltage and the negative-terminal-relay-output voltage of the power battery pack obtained in the high voltage sampling process and the preset voltage drop of the relay coil at the negative terminal of the power battery pack.

Continuing with reference to FIG. 7, a method of implementing the insulation detection for the power battery pack by the battery management system according to the embodiments of the present disclosure and steps thereof will be described in detail in the following specific embodiment.

As shown in FIG. 7, the battery management system may include the battery detection circuit in the above embodiments and the processor C1 that is connected to the battery detection circuit.

FIG. 7 also schematically shows the positions of the positive insulation resistance and the negative insulation resistance of the power battery pack to be detected in the circuit diagram of the battery detection circuit. In the figures, $R_p$ indicates the positive insulation resistance of the power battery pack, and $R_n$ indicates the negative insulation resistance of the power battery pack.

As shown by the dotted line in FIG. 7, a terminal of $R_p$ may be connected to the positive electrode of the power battery pack to be detected, and the other terminal of $R_p$ may be connected to the reference voltage terminal GND; a terminal of $R_n$ may be connected to the reference voltage terminal GND, and the other terminal of $R_n$ may be connected to the negative electrode of the power battery pack to be detected.

In FIG. 7, the processor C1 may simultaneously turn on the first switch K1 and the second switch K2. In this case, the state of the switches may be referred to as a first switch state. A positive terminal voltage $U_{p0}$ and a negative terminal voltage $U_{n0}$ of the power battery pack under the first switch state may be calculated based on the first positive sampled signal acquired from the first positive sampling point S1 and the first negative sampled signal acquired from the first negative sampling point S2 under the first switch state.

The processor C1 may turn on the first switch K1 and turn off the second switch K2. In this case, the state of the switches may be referred to as a second switch state. A positive terminal voltage $U_{p1}$ of the power battery pack under the second switch state may be calculated based on the first positive sampled signal acquired under the second switch state.

The processor C1 may turn off the first switch K1 and turn on the second switch K2. In this case, the state of the switches may be referred to as a third switch state. A negative terminal voltage $U_{n2}$ of the power battery pack under the third switch state may be calculated based on the first negative sampled signal acquired under the third switch state.

The processor C1 may calculate the positive insulation resistance value and the negative insulation resistance value of the power battery pack, based on the positive terminal voltage $U_{p0}$ of the power battery pack under the first switch state, the negative terminal voltage $U_{n0}$ of the power battery pack under the first switch state, the positive terminal voltage $U_{p1}$ of the power battery pack under the second switch state, and the negative terminal voltage $U_{n2}$ of the power battery pack under the third switch state.

First, when both of K1 and K2 are turned on, the processor C1 may obtain the following Formula (5) based on the sampled voltage $U_{mp0}$ of the first positive sampled signal and the sampled voltage $U_{mn0}$ of the first negative sampled signal acquired under the first switch state.

$$\begin{cases} U_{p0} = \dfrac{U_{mp0}(R_1 + R_2)}{R_2} \\ U_{n0} = \dfrac{U_{mn0}(R_3 + R_4)}{R_3} \\ \dfrac{U_{p0}}{U_{n0}} = \dfrac{\dfrac{R_p(R_1 + R_2)}{R_1 + R_2 + R_p}}{\dfrac{R_n(R_3 + R_4)}{R_3 + R_4 + R_n}} \\ U_B = U_{p0} + U_{n0} \end{cases} \quad (5)$$

In Formula (5), $U_{p0}$ indicates the positive terminal voltage of the power battery pack under the first switch state; $U_{n0}$ indicates the negative terminal voltage of the power battery pack under the first switch state; $R_1$ indicates the resistance value of the first resistor network; $R_2$ indicates the resistance value of the second resistor network; $R_3$ indicates the resistance value of the third resistor network; $R_4$ indicates the resistance value of the fourth resistor network; $R_p$ indicates the positive insulation resistance value of the power battery pack; and $R_n$ indicates the negative insulation resistance value of the power battery pack.

Then, when K1 is turned on and K2 is turned off, the processor C1 may obtain the following Formula (6) based on the sampled voltage $U_{mp1}$ of the first positive sampled signal acquired under the second switch state.

$$\begin{cases} U_{p1} = \dfrac{U_{mp1}(R_1 + R_2)}{R_2} \\ U_{n1} = U_B - U_{p1} \\ \dfrac{U_{p1}}{U_{n1}} = \dfrac{\dfrac{R_p(R_1 + R_2)}{R_1 + R_2 + R_p}}{R_n} \\ U_B = U_{n1} + U_{p1} \end{cases} \quad (6)$$

In Formula (6), $U_{p1}$ indicates the positive terminal voltage of the power battery pack under the second switch state; $U_{n1}$ indicates the negative terminal voltage of the power battery pack under the second switch state; $R_1$ indicates the resistance value of the first resistor network; $R_2$ indicates the resistance value of the second resistor network; $R_p$ indicates the positive insulation resistance value of the power battery pack; and $R_n$ indicates the negative insulation resistance value of the power battery pack.

Next, when K1 is turned off and K2 is turned on, the processor C1 may obtain the following Formula (7) based on the sampled voltage $U_{mn2}$ of the first negative sampled signal acquired under the third switch state.

$$\begin{cases} U_{n2} = \dfrac{U_{mn2}(R_3 + R_4)}{R_3} \\ U_{p2} = U_B - U_{n2} \\ \dfrac{U_{n2}}{U_{p2}} = \dfrac{\dfrac{R_n(R_3 + R_4)}{R_3 + R_4 + R_n}}{R_p} \\ U_B = U_{n2} + U_{p2} \end{cases} \quad (7)$$

In Formula (7), $U_{p2}$ indicates the positive terminal voltage of the power battery pack under the third switch state; $U_{n2}$ indicates the negative terminal voltage of the power battery pack under the third switch state; $R_3$ indicates the resistance value of the third resistor network; $R_4$ indicates the resistance value of the fourth resistor network; $R_p$ indicates the positive insulation resistance value of the power battery pack; and $R_n$ indicates the negative insulation resistance value of the power battery pack.

The positive insulation resistance $R_p$ and the negative insulation resistance $R_n$ of the power battery pack may be obtained by combining the Formulas (5), (6), and (7).

In some embodiments, the combined Formulas (5), (6) and (7) may be solved to obtain the positive insulation resistance $R_p$ and the negative insulation resistance $R_n$ of the power battery pack as shown by the following Formula (8), when $R_1 = R_4 = R_a$ and $R_2 = R_3 = R_b$, where $R_a$ and $R_b$ are preset resistances.

$$\begin{cases} R_p = -R_a - R_b - \dfrac{R_a U_{mp1} + R_b U_{mp1} - R_b U_B}{U_{mn2}} \\ R_n = -R_a - R_b - \dfrac{R_a U_{mn2} + R_b U_{mn2} - R_b U_B}{U_{mp1}} \end{cases} \quad (8)$$

By comparing the calculated positive insulation resistance value $R_p$ and the negative insulation resistance value $R_n$ with respective preset standard thresholds, it is possible to monitor whether the insulation resistance between the positive electrode and the negative electrode of the power battery pack meets the standard in real time, so that safety problems caused by the insulation resistance between the positive electrode and the negative electrode of the power battery pack failing to meet the standard may be avoided.

Figure 8:
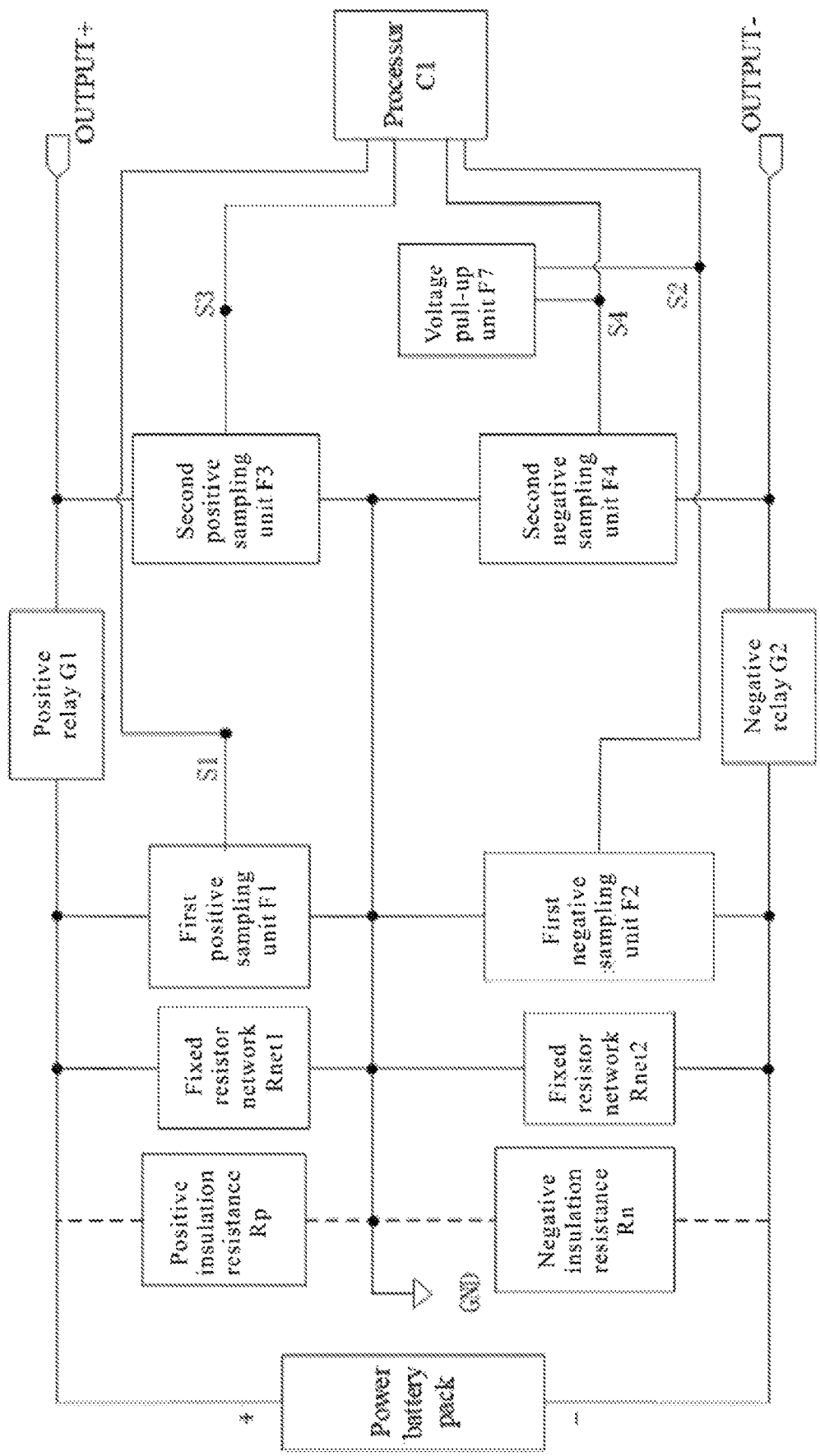
FIG. 8 is a schematic diagram showing a structure of a battery management system according to another embodiment of the present disclosure.
Figure 9:
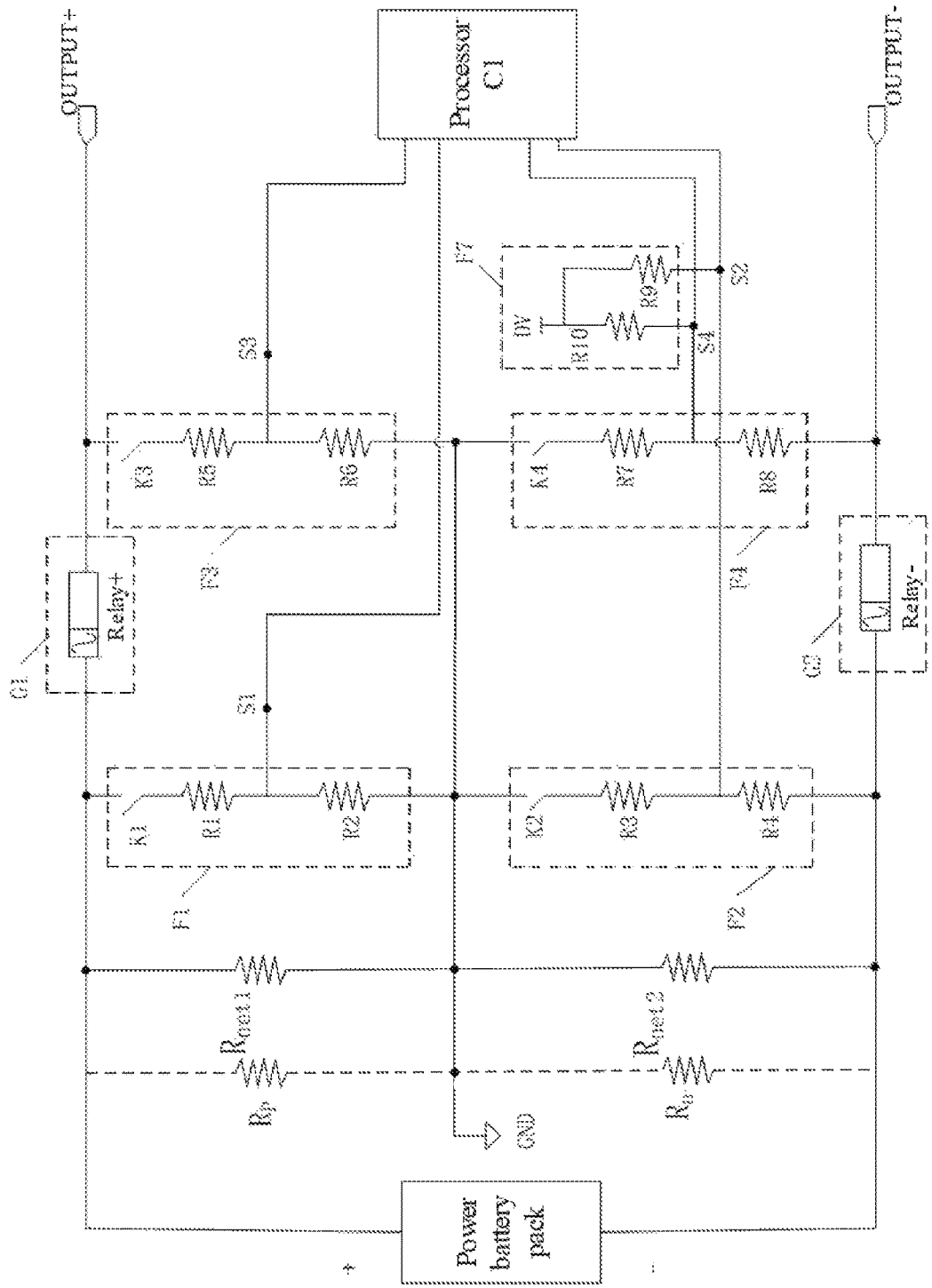
FIG. 9 is a circuit diagram of a battery management system according to another embodiment of the present disclosure.

FIG. 8 is a schematic diagram showing a structure of a battery management system according to another embodiment of the present disclosure; FIG. 9 is a circuit diagram of the battery management system according to another embodiment of the present disclosure.

Referring to FIG. 8 and FIG. 9, a process for calculating the positive insulation resistance value $R_p$ and the negative insulation resistance value $R_n$ of the power battery pack in the case that the battery detection circuit includes both the first fixed resistor network $R_{net1}$ and the second fixed resistor network $R_{net2}$ will be described in detail below in the following specific embodiments of the present disclosure.

As shown in FIG. 8, in the embodiments, the battery management system may include the battery detection circuit and the processor C1 that is connected to the battery detection circuit.

In some embodiments, experimental results show that when the difference between the positive insulation resistance $R_p$ and the negative insulation resistance $R_n$ is large, the sampling accuracy of the battery detection circuit is low; when the difference between the positive insulation resistance $R_p$ and the negative insulation resistance $R_n$ is small, the sampling accuracy of the battery detection circuit is high.

In order to improve the sampling accuracy, the battery detection circuit according to the embodiments of the present disclosure may include at least one of the first fixed resistor network $R_{net1}$ and the second fixed resistor network $R_{net2}$.

As shown in FIG. 9, first, when both of K1 and K2 are turned on, the processor C1 may obtain the following Formula (9) based on the sampled voltage $U_{mp0}$ of the first positive sampled signal and the sampled voltage $U_{mn0}$ of the first negative sampled signal acquired under the first switch state.

$$\begin{cases} U_{p0} = \dfrac{U_{mp0}(R_1 + R_2)}{R_2} \\ U_{n0} = \dfrac{U_{mn0}(R_3 + R_4)}{R_3} \\ \dfrac{U_{p0}}{U_{n0}} = \dfrac{\dfrac{(R_p // R_{net1})(R_1 + R_2)}{R_1 + R_2 + (R_p // R_{net1})}}{\dfrac{(R_n // R_{net2})(R_3 + R_4)}{R_3 + R_4 + (R_n // R_{net2})}} \\ U_B = U_{p0} + U_{n0} \end{cases} \quad (9)$$

In Formula (9), $U_{p0}$ indicates the positive terminal voltage of the power battery pack under the first switch state; $U_{n0}$ indicates the negative terminal voltage of the power battery pack under the first switch state; $R_1$ indicates the resistance value of the first resistor network; $R_2$ indicates the resistance value of the second resistor network; $R_3$ indicates the resistance value of the third resistor network; $R_4$ indicates the resistance value of the fourth resistor network; $R_p$ indicates the positive insulation resistance value of the power battery pack; $R_n$ indicates the negative insulation resistance value of the power battery pack; $R_{net1}$ indicates the resistance value of the first fixed resistor network; $R_{net2}$ indicates the resistance value of the second fixed resistor network; $R_p // R_{net1}$ indicates the parallel resistance value of the positive insulation resistance and the first fixed resistor network; and $R_n // R_{net2}$ indicates the parallel resistance value of the negative insulation resistance and the second fixed resistor network.

Then, when K1 is turned on and K2 is turned off, the processor C1 may obtain the following Formula (10) based on the sampled voltage $U_{mp1}$ of the first positive sampled signal acquired under the second switch state.

$$\begin{cases} U_{p1} = \dfrac{U_{mp1}(R_1 + R_2)}{R_2} \\ U_{n1} = U_B - U_{p1} \\ \dfrac{U_{p1}}{U_{n1}} = \dfrac{\dfrac{(R_p // R_{net1})(R_1 + R_2)}{R_1 + R_2 + (R_p // R_{net1})}}{(R_n // R_{net2})} \\ U_B = U_{n1} + U_{p1} \end{cases} \quad (10)$$

In Formula (10), $U_{p1}$ indicates the positive terminal voltage of the power battery pack under the second switch state; $U_{n1}$ indicates the negative terminal voltage of the power battery pack under the second switch state; $R_1$ indicates the resistance value of the first resistor network; $R_2$ indicates the resistance value of the second resistor network; $R_p$ indicates the positive insulation resistance value of the power battery pack; $R_n$ indicates the negative insulation resistance value of the power battery pack; $R_p//R_{net1}$ indicates the parallel resistance value of the positive insulation resistance and the first fixed resistor network; and $R_n//R_{net2}$ indicates the parallel resistance value of the negative insulation resistance and the second fixed resistor network.

Next, when K1 is turned off and K2 is turned on, the processor C1 may obtain the following Formula (11) based on the sampled voltage $U_{mn2}$ of the first negative sampled signal acquired under the third switch state.

$$\begin{cases} U_{n2} = \dfrac{U_{mn2}(R_3 + R_4)}{R_3} \\ U_{p2} = U_B - U_{n2} \\ \dfrac{U_{n2}}{U_{p2}} = \dfrac{\dfrac{(R_n // R_{net2})(R_3 + R_4)}{R_3 + R_4 + (R_n // R_{net2})}}{(R_p // R_{net1})} \\ U_B = U_{n2} + U_{p2} \end{cases} \quad (11)$$

In Formula (11), $U_{p2}$ indicates the positive terminal voltage of the power battery pack under the third switch state; $U_{n2}$ indicates the negative terminal voltage of the power battery pack under the third switch state; $R_3$ indicates the resistance value of the third resistor network; $R_4$ indicates the resistance value of the fourth resistor network; $R_p$ indicates the positive insulation resistance value of the power battery pack; $R_n$ indicates the negative insulation resistance value of the power battery pack; $R_p//R_{net1}$ indicates the parallel resistance value of the positive insulation resistance and the first fixed resistor network; and $R_n//R_{net2}$ indicates the parallel resistance value of the negative insulation resistance and the second fixed resistor network.

The positive insulation resistance $R_p$ and the negative insulation resistance $R_n$ of the power battery pack may be obtained by combining the Formulas (9), (10), and (11).

In some embodiments, the combined Formulas (9), (10) and (11) may be solved to obtain the positive insulation resistance $R_p$ and the negative insulation resistance $R_n$ of the power battery pack as shown by the following Formula (12), when $R_1=R_4=R_a$ and $R_2=R_3=R_b$, where $R_a$ and $R_b$ are preset resistances.

$$\begin{cases} R_p // R_{net1} = -R_a - R_b - \dfrac{R_a U_{mp1} + R_b U_{mp1} - R_b U_B}{U_{mn2}} \\ R_n // R_{net2} = -R_a - R_b - \dfrac{R_a U_{mn2} + R_b U_{mn2} - R_b U_B}{U_{mp1}} \end{cases} \quad (8)$$

In the embodiments, the sampling accuracy of the battery detection circuit may be improved by adding the fixed resistor network $R_{net1}$ and the fixed resistor network $R_{net2}$ as described above. Also, due to the low price of resistors, the cost-performance ratio of the battery detection circuit can be improved by reducing the cost.

With the battery detection circuit and the battery management system according to the embodiments of the present disclosure, an integral design for implementing the high voltage sampling, the insulation detection, and the relay diagnosis for the power battery pack to be detected may be conceived. Moreover, with reference to the related configuration in the battery management system, it is possible to accurately calculate the relay-input voltage and the relay-output voltage of the power battery pack, diagnose whether the relay at the positive terminal or the negative terminal of the power battery pack has failed, and detect the insulation resistance value of the power battery pack. The issues such as complex structure, high cost and low accuracy caused by separately implementing the high voltage sampling, the insulation detection and the relay diagnosis can be solved. Thus, the circuit structure can be simplified, the circuit cost can be reduced and the accurate sampling and detection results can be obtained.

It is to be noted that the embodiments of the present disclosure are not limited to the specific configurations and processes described above and shown in the drawings. Also, for the purpose of concision, the detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications and additions, or change the order of the steps after understanding the spirit of the present disclosure.

The above description is only for illustrating the specific embodiments of the present disclosure. It will be apparent to those skilled in the art that, for the sake of convenience and simplicity of description, specific operating processes of the systems, units and elements described above may be known by referring to corresponding processes in the foregoing method embodiments, and will not be repeated herein. It is to be understood that the scope of the present disclosure is not limited thereto. Within the technical scope of the present disclosure, various modifications or substitutions may be readily apparent to those skilled in the art, and all of the modifications or substitutions are to be included within the scope of the present disclosure.

What is claimed is:

1. A battery management system, comprising a battery detection circuit and a processor connected to the battery detection circuit, wherein the battery detection circuit comprises a positive relay, a negative relay, a first positive sampling unit, a first negative sampling unit, a second positive sampling unit, a second negative sampling unit, and a reference voltage terminal, wherein:

a first terminal of the positive relay is connected to a positive electrode of a power battery pack to be detected, a first terminal of the negative relay is connected to a negative electrode of the power battery pack to be detected, and each of the first positive sampling unit, the first negative sampling unit, the second positive sampling unit, and the second negative sampling unit is connected to the reference voltage terminal;

the first positive sampling unit is configured to acquire a first positive sampled signal of the power battery pack to be detected at the first terminal of the positive relay;

the first negative sampling unit is configured to acquire a first negative sampled signal of the power battery pack to be detected at the first terminal of the negative relay;

the second positive sampling unit is configured to acquire a second positive sampled signal of the power battery pack to be detected at a second terminal of the positive relay; and the second negative sampling unit is configured to acquire a second negative sampled signal of the power battery pack to be detected at a second terminal of the negative relay, wherein the battery detection circuit further comprises a first fixed resistor network and a second fixed resistor network, wherein:

the first fixed resistor network comprises at least a resistor, and the second fixed resistor network comprises at least a resistor;

the first fixed resistor network and the first positive sampling unit are connected in parallel between the positive electrode of the power battery pack to be detected and the reference voltage terminal; and the second fixed resistor network and the first negative sampling unit are connected in parallel between the negative electrode of the power battery pack to be detected and the reference voltage terminal, wherein the processor is configured to:

calculate a voltage at the first terminal of the positive relay based on the first positive sampled signal;

calculate a voltage at the first terminal of the negative relay based on the first negative sampled signal;

obtain a relay-input voltage of the power battery pack to be detected, based on the voltage at the first terminal of the positive relay and the voltage at the first terminal of the negative relay, wherein the relay-input voltage of the power battery pack to be detected is a voltage between the first terminal of the positive relay and the first terminal of the negative relay;

calculate a voltage at the second terminal of the positive relay based on the second positive sampled signal;

calculate a voltage at the second terminal of the negative relay based on the second negative sampled signal; and obtain a relay-output voltage of the power battery pack to be detected, based on the voltage at the second terminal of the positive relay and the voltage at the second terminal of the negative relay, wherein the relay-output voltage of the power battery pack to be detected is a voltage between the second terminal of the positive relay and the second terminal of the negative relay, and wherein the processor is further configured to:

control a first switch and a second switch to be in a first switch state by turning on both the first switch and the second switch;

calculate a voltage at a positive terminal of the power battery pack to be detected and a voltage at a negative terminal of the power battery pack to be detected under the first switch state, based on the first positive sampled signal and the first negative sampled signal acquired under the first switch state;

control the first switch and the second switch to be in a second switch state by turning on the first switch and turning off the second switch;

calculate the voltage at the positive terminal of the power battery pack to be detected under the second switch state, based on the first positive sampled signal acquired under the second switch state;

control the first switch and the second switch to be in a third switch state by turning off the first switch and turning on the second switch;

calculate the voltage at the negative terminal of the power battery pack to be detected under the third switch state, based on the first negative sampled signal acquired under the third switch state; and calculate a first parallel resistance value of a positive insulation resistance value of the power battery pack to be detected and a resistance value of the first fixed resistor network, and a second parallel resistance value of a negative insulation resistance value of the power battery pack to be detected and a resistance value of the second fixed resistor network, based on the voltage at the positive terminal of the power battery pack to be detected under the first switch state, the voltage at the negative terminal of the power battery pack to be detected under the first switch state, the voltage at the positive terminal of the power battery pack to be detected under the second switch state and the voltage at the negative terminal of the power battery pack to be detected under the third switch state.

2. The battery management system of claim 1, wherein the battery detection circuit further comprises a first positive sampling point, a first negative sampling point, a second positive sampling point, and a second negative sampling point, wherein:

the first positive sampling unit is further configured to provide the first positive sampled signal to the first positive sampling point;

the first negative sampling unit is further configured to provide the first negative sampled signal to the first negative sampling point;

the second positive sampling unit is further configured to provide the second positive sampled signal to the second positive sampling point; and the second negative sampling unit is further configured to provide the second negative sampled signal to the second negative sampling point.

3. The battery management system of claim 2, wherein:

a terminal of the first positive sampling unit is connected to the first terminal of the positive relay and the positive electrode of the power battery pack to be detected, and the other terminal of the first positive sampling unit is connected to the first positive sampling point and the reference voltage terminal;

a terminal of the first negative sampling unit is connected to the first terminal of the negative relay and the negative electrode of the battery pack to be detected, and the other terminal of the first negative sampling unit is connected to the first negative sampling point and the reference voltage terminal;

a terminal of the second positive sampling unit is connected to the second terminal of the positive relay, and the other terminal of the second positive sampling unit is connected to the second positive sampling point and the reference voltage terminal;

a terminal of the second negative sampling unit is connected to the second terminal of the negative relay, and the other terminal of the second negative sampling unit is connected to the second negative sampling point.

4. The battery management system of claim 3, wherein:

the first positive sampling unit comprises a first resistor network and a second resistor network in series;

a terminal of the first resistor network is connected to the first terminal of the positive relay and the positive electrode of the power battery pack to be detected, and the other terminal of the first resistor network is connected to the first positive sampling point and a terminal of the second resistor network; and the other terminal of the second resistor network is connected to the reference voltage terminal.

5. The battery management system of claim 4, wherein:

the first positive sampling unit further comprises a first switch; and a terminal of the first resistor network is connected, via the first switch, to the positive electrode of the power battery pack to be detected.

6. The battery management system of claim 3, wherein:

the first negative sampling unit comprises a third resistor network and a fourth resistor network in series;

a terminal of the third resistor network is connected to the reference voltage terminal, and the other terminal of the third resistor network is connected to the first negative sampling point and a terminal of the fourth resistor network; and the other terminal of the fourth resistor network is connected to the first terminal of the negative relay and the negative electrode of the power battery pack to be detected.

7. The battery management system of claim 6, wherein:
the first negative sampling unit further comprises a second switch; and
a terminal of the third resistor network is connected to the reference voltage terminal via the second switch.

8. The battery management system of claim 3, wherein:
the second positive sampling unit comprises a fifth resistor network and a sixth resistor network in series;
a terminal of the fifth resistor network is connected to the second terminal of the positive relay, and the other terminal of the fifth resistor network is connected to the second positive sampling point and a terminal of the sixth resistor network; and
the other terminal of the sixth resistor network is connected to the reference voltage terminal.

9. The battery management system of claim 8, wherein:
the second positive sampling unit further comprises a third switch; and
a terminal of the fifth resistor network is connected to the second terminal of the positive relay via the third switch.

10. The battery management system of claim 3, wherein:
the second negative sampling unit comprises a seventh resistor network and an eighth resistor network in series;
a terminal of the seventh resistor network is connected to the reference voltage terminal, and the other terminal of the seventh resistor network is connected to the second negative sampling point and a terminal of the eighth resistor network; and
the other terminal of the eighth resistor network is connected to the second terminal of the negative relay.

11. The battery management system of claim 10, wherein:
the second negative sampling unit further comprises a fourth switch; and
a terminal of the seventh resistor network is connected to the reference voltage terminal via the fourth switch.

12. The battery management system of claim 2, wherein the battery detection circuit further comprises a first voltage pull-up unit and a second voltage pull-up unit, wherein:
the first voltage pull-up unit is connected to the first negative sampling point, and the first voltage pull-up unit is configured to pull up the first negative sampled signal to be a positive voltage signal;
the second voltage pull-up unit is connected to the second negative sampling point, and the second voltage pull-up unit is configured to pull up the second negative sampled signal to be a positive voltage signal.

13. The battery management system of claim 12, wherein:
the first voltage pull-up unit comprises a first DC voltage source and a ninth resistor network; and
a terminal of the ninth resistor network is connected to the first negative sampling point, and the other terminal of the ninth resistor network is connected to the first DC voltage source.

14. The battery management system of claim 12, wherein:
the second voltage pull-up unit comprises a second DC voltage source and a tenth resistor network; and
a terminal of the tenth resistor network is connected to the second negative sampling point, and the other terminal of the tenth resistor network is connected to the second DC voltage source.

15. The battery management system of claim 1, further configured to:
diagnose an operating state of the positive relay based on a preset voltage threshold of the positive relay, the voltage at the first terminal of the positive relay and the voltage at the second terminal of the positive relay; and
diagnose an operating state of the negative relay based on a preset voltage threshold of the negative relay, the voltage at the first terminal of the negative relay and the voltage at the second terminal of the negative relay.

* * * * *